(12) United States Patent
Yang

(10) Patent No.: US 6,509,790 B1
(45) Date of Patent: Jan. 21, 2003

(54) SWITCHED-CAPACITOR CIRCUITS AND METHODS WITH IMPROVED SETTLING TIME AND SYSTEMS USING THE SAME

(75) Inventor: Yu Ang Yang, Austin, TX (US)

(73) Assignee: Cirrus Logic, Inc.

( * ) Notice: Subject to any disclaimer, the term of this patent is extended or adjusted under 35 U.S.C. 154(b) by 0 days.

(21) Appl. No.: 09/904,649

(22) Filed: Jul. 12, 2001

(51) Int. Cl.$^7$ .............................. H03K 5/00; H03M 1/12
(52) U.S. Cl. ............................ 327/554; 327/337; 330/9; 341/172
(58) Field of Search .......................... 327/554, 94, 362; 330/9; 341/172

(56) References Cited
U.S. PATENT DOCUMENTS 5,703,589 A * 12/1997 Kalthoff et al. ............. 341/172

* cited by examiner

Primary Examiner—Dinh T. Le
(74) Attorney, Agent, or Firm—James J. Murphy, Esq.; Winstead Sechrest & Minick, P.C.

(57) ABSTRACT

A switched capacitor circuit (300) including an operational amplifier (206) having an input and an output, a sampling capacitor (203) and a set of switches (204, 205, 301, and 302) are disclosed. During a first phase, switches (201, 204) sample an input voltage by charging sampling capacitor (203). During a first portion of a second phase, the operational amplifier input is electrically coupled to sampling capacitor (203) through a first path including switch (301) having a first time constant. During a second portion of the second phase, the operational amplifier input is electrically coupled with sampling capacitor (203) through a second path including switch (302) having a second time constant, the second time constant being smaller than the first time constant.

21 Claims, 3 Drawing Sheets

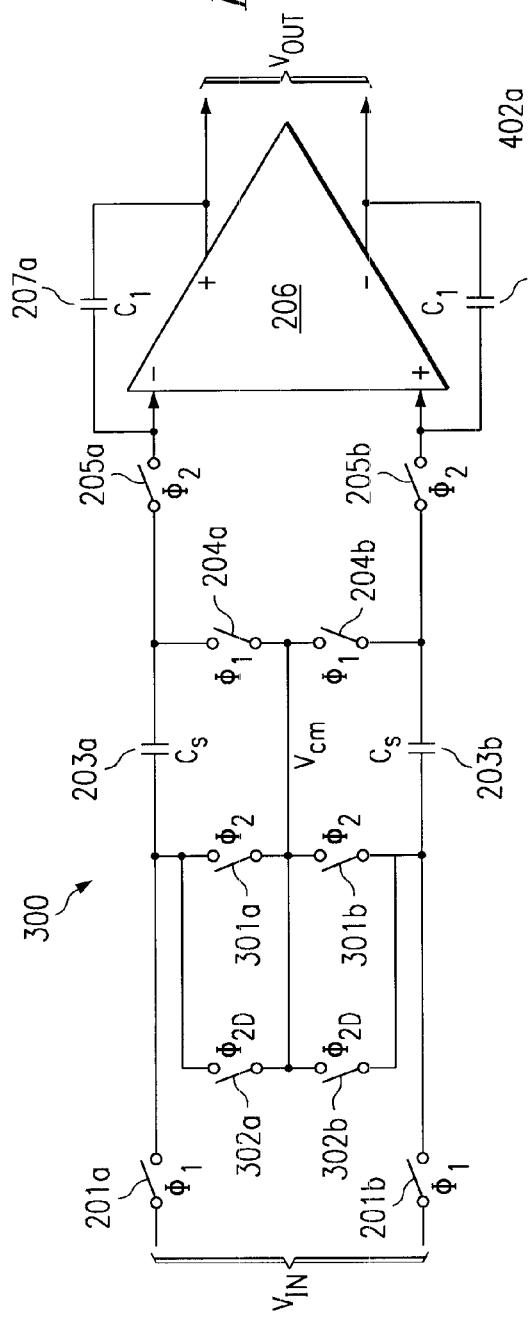
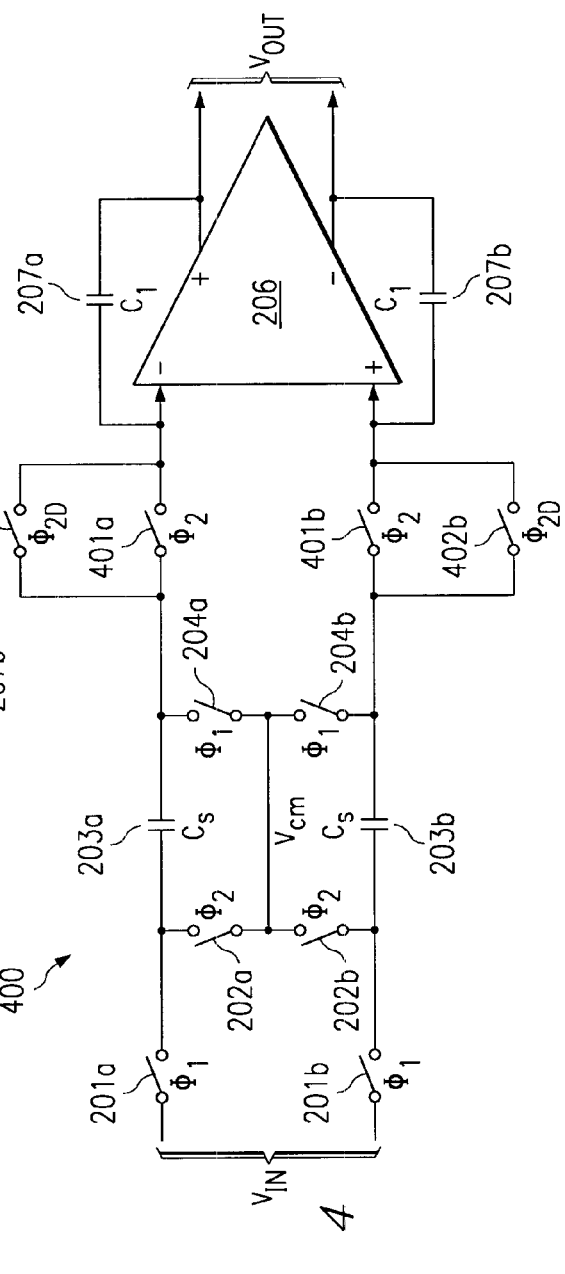
FIG. 3
FIG. 4

SWITCHED-CAPACITOR CIRCUITS AND METHODS WITH IMPROVED SETTLING TIME AND SYSTEMS USING THE SAME

CROSS REFERENCE TO RELATED APPLICATIONS

This application for patent is related to the following applications for patent:

Pending U.S. patent application Ser. No. 09/904,940, filed Jul. 12, 2001 by inventor Yu Qing YANG and entitled "SWITCHED-CAPACITOR SUMMER CIRCUITS AND METHODS AND SYSTEMS USING THE SAME"; and Pending U.S. patent application Ser. No. 09/870,900, filed May 30, 2001 by inventor Yu Qing YANG and entitled "SWITCHED-CAPACITOR SUMMER CIRCUITS AND METHODS AND SYSTEMS USING THE SAME".

BACKGROUND OF THE INVENTION

1. Field of the Invention

The present invention relates in general to switched-capacitor circuitry and methods and in particular to switched-capacitor circuits and methods with improved settling time and systems using the same.

2. Description of the Related Art

Switched-capacitor circuits are used in a wide range of applications, including analog-to-digital converters (ADCs), digital-to-analog converters (DACs) delta-sigma modulators, filters, power supplies, and voltage regulators. Generally, switched capacitor techniques allow for the construction of accurate, compact, frequency tunable circuits without the use of resistors. This is particularly advantageous in integrated circuit designs, where the construction of precise resistor-based circuits is difficult and unnecessarily consumes chip area.

In the basic switched-capacitor integrator, an input voltage is sampled onto a sampling capacitor during a first clock phase. During a second (non-overlapping) clock phase, the charge on the sampling capacitor is transferred to the integrator capacitors. The output of the integrator is fedback to the summing node with a integrator capacitor. The impedance of the circuit depends on the size of the sampling and integrator capacitors and the frequency of the clock.

One of the key performance parameters in switched-capacitor circuits is the settling time. In particular, it is important that the circuit output ramp to its final value quickly and smoothly. This is particularly true in high performance applications, such as audio analog-to-digital and digital-to-analog conversion circuits where discontinuities in the circuit response can affect the ultimate quality of the audio signal presented to the listener.

SUMMARY OF THE INVENTION

According to one such embodiment, a switched capacitor circuit is disclosed which includes an operational amplifier having an input and an output, a sampling capacitor and a set of switches. During a first phase, a set of switches samples an input voltage by charging sampling capacitor. During a first portion of a second phase, the operational amplifier input is electrically coupled to sampling capacitor with a first path having a first time constant. During a second portion of the second phase, the operational amplifier input is electrically coupled with the sampling capacitor through a second path having a second time constant, the second time constant being smaller than the first time constant.

The present inventive principles substantially reduce the settling time when a switched capacitor techniques are being practiced. Specifically, circuits and methods are disclosed which substantially reduce the negative output spikes in switched capacitor circuits by controlling the rate of voltage change at the switch capacitor circuit summing nodes. In particular, multiple sets of switches are provided for transferring charge to the summing node. One set of switches has a large time constant such that the voltage change is relatively slow and a second set of switches has a smaller time constant such that the change in voltage at the summing node is relatively rapid.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 illustrates a first technique for substantially reducing or eliminating the negative voltage spike shown in FIG. 2 according to the present inventive concepts; and FIG. 4 illustrates an alternate switched-capacitor network 400 according to the inventive principles.

DESCRIPTION OF THE PREFERRED EMBODIMENTS

The principles of the present invention and their advantages are best understood by referring to the illustrated embodiment depicted in FIGS. 1–4 of the drawings, in which like numbers designate like parts.

Figure 1A:
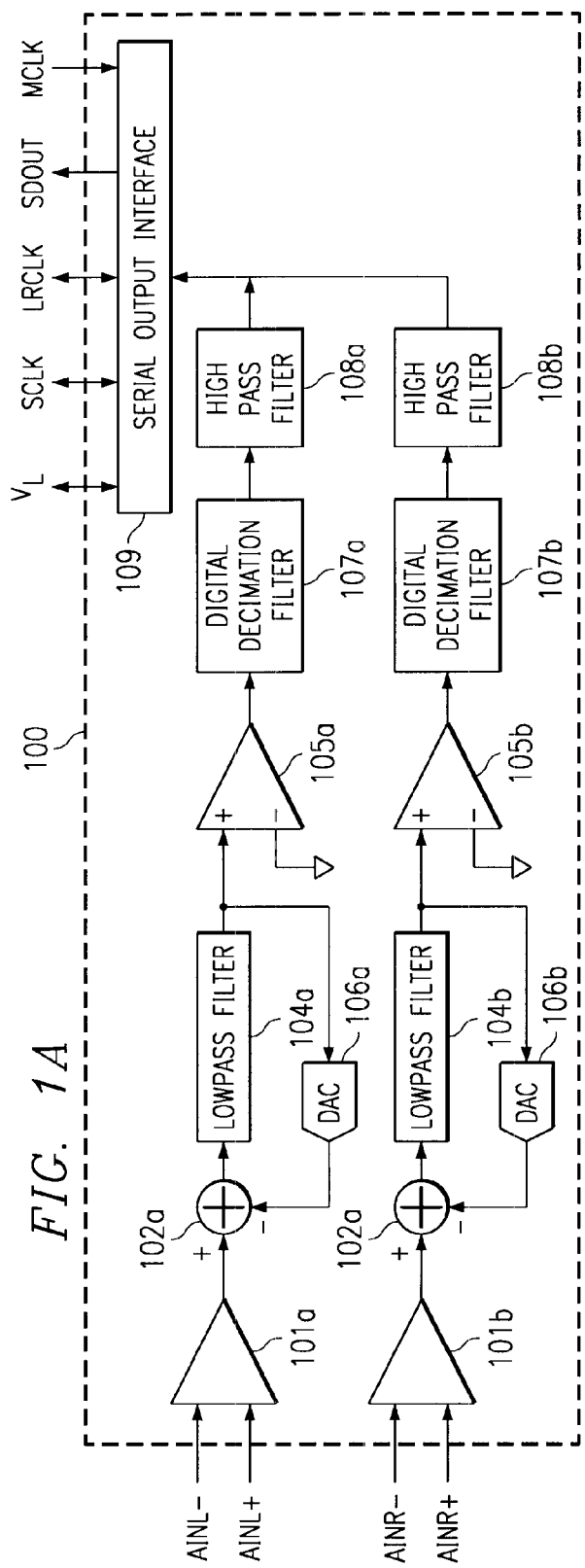
FIG. 1A is a functional block diagram of a single-chip analog to digital converter suitable for illustrating the present inventive principles; invention

FIG. 1A is a high level functional block diagram of a single-chip audio analog-to-digital (A/D) 100 suitable for practicing the principles of the present invention. A/D converter 100 is only one of a number of possible applications requiring switched-capacitor integrator stages. Other examples include digital to analog converters (DACs) and Codecs.

A/D converter 100 includes two conversion paths for converting left and right channel analog audio data respectively received at the left and right analog differential inputs AINL+/− and AINR+/−. The analog inputs are passed through an input gain stage 101 and then to a 5th order delta-sigma modulator.

Each delta-sigma modulator is represented in FIG. 1 by a summer 102, low-pass filter 104 (quantizer), comparator 105 and DAC 106 in the feedback loop. The outputs from the delta-sigma modulators are passed through a decimation filter 107 and a high pass filter 108.

The resulting left and right channel digital audio data are output through a single serial port SDOUT, timed with a serial clock SCLK and a left-right clock LRCLK in accordance with the Digital Interface Format (DIF). The SCLK and LRCLK clocks can be generated externally and input to converter 100 or can be generated on-chip, along with the associated data, in response to a received master clock MCLK.

Figure 1C:
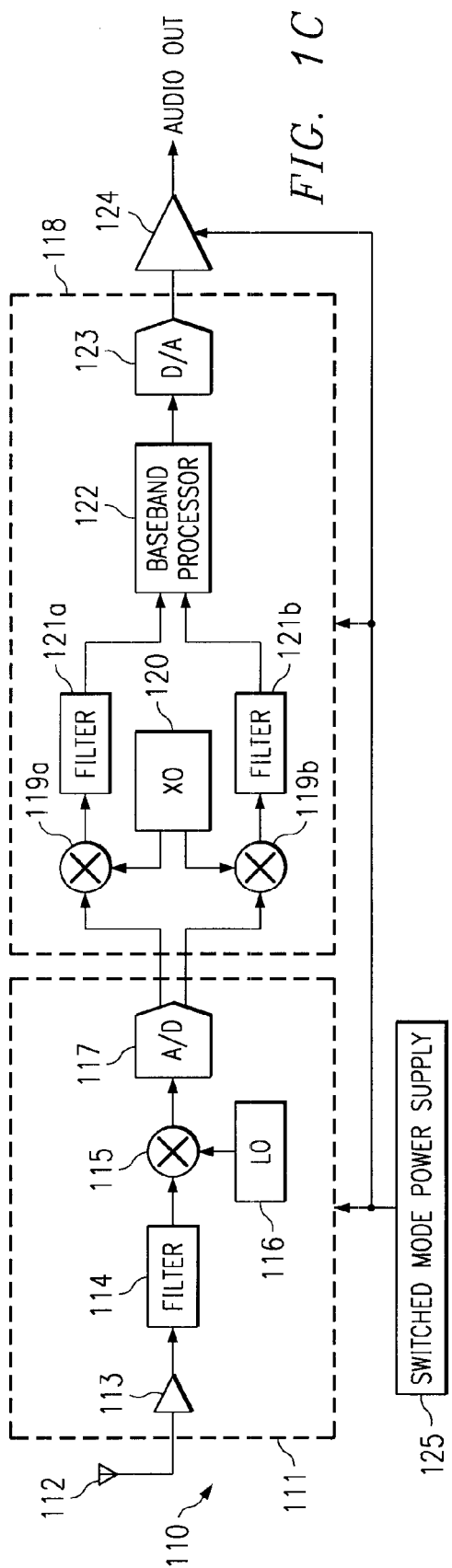
FIG. 1C is a functional block diagram of a digital radio employing 1C and analog to digital converter such as shown in FIG. 1A.
Figure 1B:
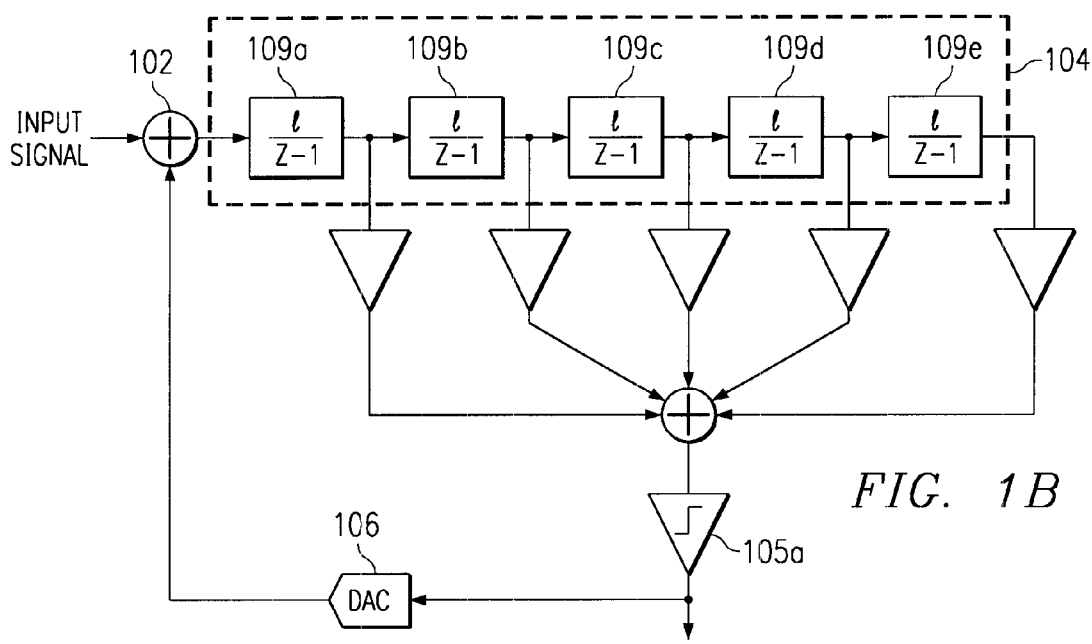
FIG. 1B is functional block diagram of a 5th Order delta-sigma modulator suitable for use in the analog to digital converter of FIG. 1A.

If 5th order delta-sigma modulators are used in system 100, each low pass filter 104 comprises 5 integrator stages 109 as shown in FIG. 1B. Integrator stages 109 are one of a number of possible applications of switched capacitor integrators 300 and 400 according to the inventive concepts discussed below.

One possible application of A/D converter is in a digital radio 110, such as that shown in FIG. 1C.

Digital radio 110 includes an analog section or front-end 111 which receives radio frequency (RF) signals from an associated antenna 112. Analog front-end 111 is preferably a conventional RF down-converter including a low noise amplifier (LNA) 113 for setting the system noise figure, a bandpass filter 114 and mixer 115 driven by an analog local oscillator 116. The mixed-down analog signal is then converted into digital form by analog to digital converter 117.

The digitized data output from A/D converter 117 is passed to digital processing section 118. A pair of mixers 119a,b generate in-phase (I) and quadrature (Q) signals from a corresponding pair of clock phases from crystal oscillator 120. The I and Q signals are next passed through bandpass filters 121a and 121b and on to digital baseband processor 122. The processed digital signal is then re-converted to analog (audio) form by D/A converter 123.

A switched mode (Class D) audio power amplifier (APA) 124 is used to drive an external set of speakers or a headset. Preferably, at least some of the components of digital radio 110 are powered by a switched mode power supply (SMPS) 124.

Figure 2A:
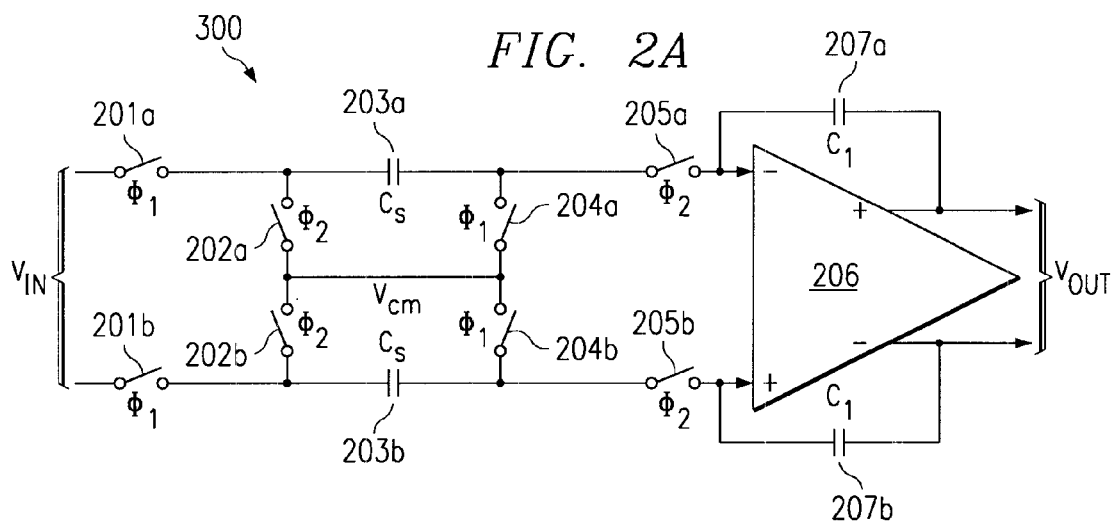
FIG. 2A illustrates an exemplary fully-differential conventional delayed switched-capacitor integrator.

An exemplary fully-differential conventional delayed switched-capacitor integrator 200 is shown in FIG. 2A. Integrator 200 generally works as follows. During clock Phase 1 ($\phi_1$) switches 201a,b and 204a,b close and the input voltage $V_{In}$ is sampled onto sampling capacitors Cs 203a,b. During clock Phase 2 ($\phi_2$), switches 201a,b and 204a,b open and switches 202a,b and 205a,b close. Consequently, the charge on sampling capacitors Cs to the summing nodes of op amp 206 and onto capacitors 207a,b.

The size of sampling capacitor Cs, and accordingly the amount of charge transferred, will be very large in high performance A/D and D/A converters, and similar applications. Specifically, the charge being transferred is in accordance with the relation:

$$C=Q(V_{LEFT}-V_{RIGHT}) \quad (1)$$

where:

C is the capacitance, Q is the charge stored on the capacitor, $V_{LEFT}$ is the voltage on the left capacitor plate, and $V_{RIGHT}$ that on the right capacitor plate. In the present example, the charge Q and capacitance C are fixed.

Figure 2B:
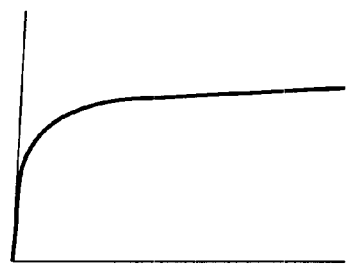
FIG. 2B illustrates the ideal response.
Figure 2C:
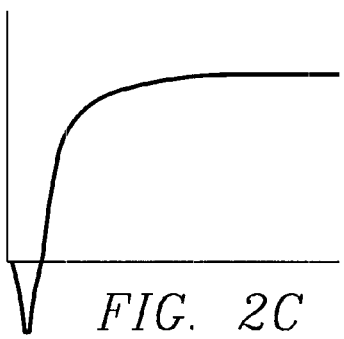
FIG. 2C illustrates the embodiment in which this creates a negative spike in the output

During the initial period of Phase 2, (after switches 202a,b and 205a,b have closed), the voltage on the left plate of sampling capacitors $C_S$ changes from $V_{IN}$ (i.e., the final voltage at the end of Phase 1) to $V_{cm}$. At the same time, the charge on sampling capacitors $C_S$ remains the same, just before it begins to be transferred out. According to Equation 1, the right plate voltage on sampling $C_S$ (i.e. the summing nodes) also must change by the same amount as the left plate voltage, which normally is a larger voltage swing. Consequently, op amp 206 must pull the summing nodes back to common mode voltage ($V_{CM}$) before it can start to ramp-up the output voltage $V_{Out}$ to its final value. This creates a negative spike in the output as shown in FIG. 2C (the ideal response is shown in FIG. 2B for reference). Because the length of Phase 2 is fixed, this phenomena seriously affects the settling of the circuit output Moreover, in order to improve the settling behavior of the conventional integrator shown in FIG. 2, switches 202a,b and/or 205a,b are usually selected to be large so as to decrease the time constant of the switched-capacitor network (i.e. speed up the response). However, as the speed of the network increases, the negative spike shown in FIG. 2C also grows larger.

FIG. 3 illustrates a first technique for substantially reducing or eliminating the negative voltage spike shown in FIG. 2 according to the present inventive concepts. In this embodiment, the time constant of the switched-capacitor network 300 is varied using sets of parallel switches 301a,b and 302a,b in place of switches 202a,b in the embodiment of FIG. 2A.

In network 300, switches 301a,b are selected to be small such that they have a large resistance while switches 302a,b are selected to be large such that they have a small resistance. Small switches 301a,b therefore increase the time constant and make network 300 slower. On the other hand, large switches 302a,b decrease the time constant and make the network faster. Network 300 preferably operates as follows.

During Phase 1, switches 204a,b close and the input voltage $V_{In}$ is sampled onto sampling capacitors $C_S$. At the same time, switches 205a,b are open such that the summing nodes of op amp 206 are at the voltage on integrator capacitors $C_I$.

Small switches 301a,b close first during Phase 2 in response to the clock signal $\phi_2$ and switches 204a,b open. When only small switches 301a,b are closed, and the network 300 is slower (i.e. the RC time constant is increased) which forces the voltages the summing inputs to integrator 206 to change more slowly. Consequently, the magnitude of "negative" spike at the integrator output becomes much smaller.

Large switches 302a,b are subsequently closed, after the introduction of a delay, by the clock signal $\phi_{2D}$. In particular, after op amp 206 has pulled the summing nodes almost back to common mode voltage VCM, large switches 302a,b are closed such that network 300 becomes significantly faster. The electric charge on sampling capacitors $C_S$ is transferred to the integrator capacitors $C_I$ at full speed.

FIG. 4 illustrates an alternate switched-capacitor network 400 according to the inventive principles. In this case, switches 205a,b in the conventional embodiment are replaced by sets of parallel switches 401a,b and 402a,b. Small switches 401a,b are closed during the start of Phase 2 in response to clock signal $\phi_2$ to slowly bring the voltages at the summing nodes the common node voltage and minimize the negative voltage spike. Large switches 402a,b are subsequently closed after a delay by delayed clock signal $\phi_{2D}$ to transfer the charge on sampling capacitors $C_S$ on to the integrator capacitors $C_I$ rapidly. In other words, as was done in network 300, a large time constant is used during the initial phase to minimize spikes in the output while a smaller time constant is used to fully charge the integrator capacitors and ramp the output voltage.

Although the present invention and its advantages have been described in detail, it should be understood that various changes, substitutions and alterations can be made herein without departing from the spirit and scope of the invention as defined by the appended claims.

What is claimed is:

1. A switched-capacitor circuit comprising:

a sampling capacitor having first and second nodes;

a first switch for coupling the first node of the sampling capacitor to a common mode voltage during a first timing phase to sample an input voltage onto the sampling capacitor;

an operational amplifier having and an input and an output;

an integrator capacitor coupling the input and the output of the operational amplifier;

a second switch for coupling the first node of the sampling capacitor to the input of the operational amplifier during a second timing phase;

a third switch for coupling the second node of the sampling capacitor to the common mode voltage during a first portion of the second phase, a size of the third switch selected such that the third switch has a resistance for slowly transitioning the input of the operational amplifier to the common mode voltage; and a fourth switch for coupling the second node of the sampling capacitor to the common mode voltage during a second portion of the second phase, a size of the fourth switch selected such that the fourth switch has a resistance for rapidly charging the integrator capacitor from the sampling capacitor.

2. The switched-capacitor circuit of claim 1 wherein the third and fourth switches comprise metal-oxide semiconductor transistors.

3. The switched-capacitor circuit of claim 1 wherein the input of the integrator comprises an inverting input.

4. The switched-capacitor circuit of claim 1 wherein the input of the integrator comprises a non-inverting input.

5. The switched capacitor circuit of claim 1 and further comprising:

a first sampling capacitor having first and second nodes;

a fifth switch for coupling the first node of the second sampling capacitor to the common mode voltage during the first timing phase to sample the input voltage onto the first sampling capacitor;

a second sampling capacitor coupling a second input and a second output of the operational amplifier;

a sixth switch for coupling the first node of the second sampling capacitor to the second input of the operational amplifier during the second timing phase;

a seventh switch for coupling the second node of the sampling capacitor to the common mode voltage during a first portion of the second phase, a size of the seventh switch selected such that the seventh switch has a resistance for slowly transitioning the second input of the operational amplifier to the common mode voltage; and an eighth switch for coupling the second node of the first sampling capacitor to the common mode voltage during a second portion of the second phase, a size of the eighth switch selected such that the eighth switch has a resistance for rapidly charging the integrator capacitor from the sampling capacitor.

6. A switched-capacitor integrator comprising:

a sampling capacitor having first and second nodes;

a first switch for selectively coupling said first node of said sampling capacitor to a common mode voltage during a first timing phase for sampling charge onto said sampling capacitor;

a second switch for selectively coupling said second node of said sampling capacitor to the common mode voltage during a second timing phase for transferring charge from said sampling capacitor;

an integrator comprising an operational amplifier having an input and an output and a capacitor coupling said input and said output;

a third switch for coupling said first node of said sampling capacitor to said input of said integrator during a first portion of said second phase and having a size selected such that said third switch has a resistance changing a voltage at said input of said integrator at a first rate; and a fourth switch for coupling said first node of said sampling capacitor to said input of said integrator during a second portion of said second phase and having a size selected such that said fourth switch has a resistance for changing the voltage at said input of said integrator at a second rate, said second rate being greater than said first rate.

7. The switched-capacitor integrator of claim 6 wherein said third and fourth switches comprise metal-oxide semiconductor transistors, a size of said transistor forming said third switch being smaller than a size of said transistor forming said fourth switch.

8. The switched-capacitor integrator of claim 6 wherein said input of said integrator comprises a noninverting input.

9. The switched-capacitor integrator of claim 6 wherein said input of said integrator comprises an inverting input.

10. The switched-capacitor integrator of claim 6 and further comprising:

a second sampling capacitor having first and second nodes;

a fifth switch for selectively coupling said first node of said second sampling second capacitor to the common mode voltage during the first timing phase for sampling charge onto said sampling capacitor;

a sixth switch for selectively coupling said second node of said second sampling capacitor to the common mode voltage during the second timing phase for transferring charge from said second sampling capacitor;

a seventh switch for coupling said first node of said second sampling capacitor to a second input of said integrator during said first portion of said second phase and having a size selected such that the seventh switch has a resistance for changing a voltage at said second input of said integrator at a first rate; and a eight switch for coupling said first node of said second sampling capacitor to said input of said integrator during said second portion of said second phase and having a size selected such that the eight switch has a resistance for changing the voltage at said input of said integrator at a second rate, said second rate being greater than said first rate.

11. A method of minimizing spikes in an output voltage of a switched-capacitor circuit comprising the steps of:

during a first phase, sampling an input voltage by charging a sampling capacitor;

during a first portion of a second phase, selectively electrically coupling a summing node coupled to an integration capacitor and an operational amplifier input with the sampling capacitor through a path having a first resistance; and during a second portion of the second phase, selectively electrically coupling the summing node with the sampling capacitor through a second path having a second resistance, the second time constant being smaller than the first resistance.

12. The method of claim 11 wherein said steps of selectively electrically coupling the summing node and the sampling capacitor comprise the substeps of:

coupling a first plate of the sampling capacitor with the summing node;

during the first portion of the second phase, coupling a second plate of the sampling capacitor to a common mode voltage through a first resistance; and during the second portion of the second phase, coupling the second plate of the sampling capacitor to the common mode voltage through a second resistance, the second resistance being smaller than the first resistance.

13. The method of claim 12 wherein said steps of coupling the selected plate of the sampling capacitor through first and second resistances comprise the steps of coupling the selected plate of the sampling capacitor through first and second transistors of differing sizes.

14. The method of claim 11 wherein the summing node comprises a summing node at an input of an operational amplifier.

15. The method of claim 11 wherein the operational amplifier comprises a portion of an integrator including an integrator capacitor coupling the input and an output of the operational amplifier.

16. The method of claim 11 wherein said steps of selectively electrically coupling the summing node and the sampling capacitor comprise the substeps of:

coupling a first plate of the sampling capacitor to a common mode voltage;

during the first portion of the second phase, coupling a second plate of the sampling capacitor with the summing node through a first switch having a first resistance; and during the second portion of the second phase, coupling the second plate of the sampling capacitor with the summing node through a second switch having a second resistance, the first resistance being larger than the second resistance.

17. The method of claim 16 wherein the first and second resistances are implemented in transistors of corresponding sizes.

18. A switched-capacitor circuit comprising:

an operational amplifier having an input and an output;

a sampling capacitor; and a set of switches for:
 during a first phase, sampling an input voltage by charging the sampling capacitor;
 during a first portion of a second phase, electrically coupling the operational amplifier input with the sampling capacitor with a first switch having a first resistance producing a first time constant; and
 during a second portion of the second phase, electrically coupling the operational amplifier input with the sampling capacitor through a second switch having a second resistance producing a second time constant, the second time constant being smaller than the first time constant.

19. The switched-capacitor circuit of claim 18 and further comprising an integration capacitor coupling the operational amplifier input and output.

20. The switched-capacitor circuit of claim 18 wherein the set of switches comprises:

a first switch for coupling a first plate of the sampling capacitor with the operational amplifier input;

a second switch for coupling a second plate of the sampling capacitor to a common mode voltage during the first portion of the second phase; and a third switch for coupling the second plate of the sampling capacitor to the common mode voltage during the second portion of the second phase, the third switch being larger than the second switch.

21. The switched-capacitor circuit of claim 18 wherein the set of switches comprises:

a first switch for coupling a first plate of the sampling capacitor to a common mode voltage;

a second switch for coupling a second plate of the sampling capacitor with the operational amplifier input during the first portion of the second phase; and a third switch for coupling the second plate of the sampling capacitor with the operational amplifier input during the second portion of the second phase, the third switch being larger than the second switch.

* * * * *

UNITED STATES PATENT AND TRADEMARK OFFICE
CERTIFICATE OF CORRECTION

PATENT NO. : 6,509,790 B1
DATED : January 21, 2003
INVENTOR(S) : Yu Qing Yang

It is certified that error appears in the above-identified patent and that said Letters Patent is hereby corrected as shown below:

Title page,
Item [75], before "Austin, TX (US) delete "Yu Ang Yang" and insert
-- YuQing Yang --;
Lines 11 and 16, after "2001 by inventor" delete "Yu Qing YANG" and insert
-- YuQing YANG --;

Column 2,
Line 24, after "inventive principles;" delete "invention".

Signed and Sealed this

Twenty-ninth Day of July, 2003

JAMES E. ROGAN
*Director of the United States Patent and Trademark Office*